United States Patent
Zepeda et al.

(10) Patent No.: US 10,407,797 B2
(45) Date of Patent: Sep. 10, 2019

(54) CRYSTAL PULLING SYSTEM AND METHOD INCLUDING CRUCIBLE AND BARRIER

(71) Applicant: Corner Star Limited, Kowloon (HK)

(72) Inventors: Salvador Zepeda, St. Peters, MO (US); Richard J. Phillips, St. Peters, MO (US); Christopher Vaughn Luers, O'Fallon, MO (US)

(73) Assignee: Corner Start Limited, Kowloon (HK)

( * ) Notice: Subject to any disclaimer, the term of this patent is extended or adjusted under 35 U.S.C. 154(b) by 0 days.

(21) Appl. No.: 15/587,008

(22) Filed: May 4, 2017

(65) Prior Publication Data
US 2018/0320287 A1    Nov. 8, 2018

(51) Int. Cl.
| C30B 15/12 | (2006.01) |
| C30B 15/02 | (2006.01) |
| C30B 29/06 | (2006.01) |
| C30B 15/00 | (2006.01) |

(52) U.S. Cl.
CPC ............ C30B 15/12 (2013.01); C30B 15/002 (2013.01); C30B 15/02 (2013.01); C30B 29/06 (2013.01)

(58) Field of Classification Search
CPC combination set(s) only.
See application file for complete search history.

(56) References Cited

U.S. PATENT DOCUMENTS

| 2,892,739 | A | * | 6/1959 | Rusler | C30B 15/02 |
| | | | | | 117/19 |
| 4,659,421 | A | * | 4/1987 | Jewett | C30B 15/02 |
| | | | | | 117/21 |
| 5,021,225 | A | * | 6/1991 | Yamashita | C30B 15/12 |
| | | | | | 117/213 |
| 8,262,797 | B1 | * | 9/2012 | Bender | C30B 29/06 |
| | | | | | 117/217 |
| 2008/0000413 | A1 | * | 1/2008 | Nawata | C30B 15/02 |
| | | | | | 117/31 |
| 2014/0261154 | A1 | | 9/2014 | Swaminathan et al. | |

FOREIGN PATENT DOCUMENTS

| DE | 19700516 A1 | 7/1997 |
| EP | 0425065 A1 | 5/1991 |

OTHER PUBLICATIONS

International Search Report and Written Opinion of the International Searching Authority regarding PCT/US2018/029765 dated Jun. 14, 2018; pp. 1-17.

* cited by examiner

*Primary Examiner* — Erin F Bergner
(74) *Attorney, Agent, or Firm* — Armstrong Teasdale LLP (57) ABSTRACT

A system for forming an ingot from a melt includes a first crucible defining a cavity for receiving the melt and a second crucible in the cavity. The second crucible separates an outer zone from an inner zone. The second crucible includes a passageway therethrough to allow the melt located within the outer zone to move into the inner zone. The inner zone defines a growth area for the ingot. The system also includes a barrier located within the outer zone to limit movement of the melt through the outer zone. The barrier includes members that are arranged to define a labyrinth for melt flow.

22 Claims, 6 Drawing Sheets

CRYSTAL PULLING SYSTEM AND METHOD INCLUDING CRUCIBLE AND BARRIER

FIELD

This disclosure generally relates to monocrystalline pulling systems for forming ingots of semiconductor or solar material from a melt, and more particularly to systems and methods including a crucible and a barrier that limits movement within the melt.

BACKGROUND

In the production of silicon monocrystals grown by the Czochralski (CZ) method, polycrystalline silicon is melted within a crucible, such as a quartz crucible, of a crystal pulling device to form a silicon melt. A puller lowers a seed crystal into the melt and slowly raises the seed crystal out of the melt, solidifying the melt onto the seed crystal to form an ingot. In a continuous CZ method, polycrystalline silicon is added to the melt while the seed crystal is raised out of the melt. The addition of polycrystalline silicon may affect the temperature of the melt and may generate disturbances along the surface of the melt. However, the temperature and the stability of the surface of the melt immediately adjacent to the ingot must be maintained substantially constant to produce a high quality single crystal. In addition, the melt immediately adjacent to the ingot must be kept free of solid feedstock. Also, characteristics of the melt such as oxygen content must be closely controlled. Prior systems for accomplishing these goals have not been completely satisfactory. Thus, there exists a need for a more efficient and effective system and method to control characteristics of the melt immediately adjacent to the ingot.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a system for forming an ingot from a melt includes a first crucible defining a cavity for receiving the melt and a second crucible in the cavity. The second crucible separates an outer zone from an inner zone. The second crucible includes a passageway therethrough to allow the melt located within the outer zone to move into the inner zone. The inner zone defines a growth area for the ingot. The system also includes a barrier located within the outer zone to limit movement of the melt through the outer zone. The barrier includes members that are arranged to define a labyrinth for melt flow.

In another aspect, a system for forming an ingot from a melt includes a crucible defining a cavity for receiving the melt and a weir connected to the crucible. The weir is positioned in the cavity to limit movement of the melt from outward of the weir to inward of the weir. The crucible and the weir form an outer zone and an inner zone. The weir includes a passageway to allow the melt located within the outer zone to move into the inner zone. The system also includes a barrier within the outer zone to limit movement of the melt through the outer zone. The barrier includes members that are arranged to define a labyrinth of gaps for melt flow.

In another aspect, a method for pulling a crystal ingot from a melt in a crystal pulling system is described. The system includes a crucible defining a cavity. The method includes placing a first barrier within the cavity to limit movement of the melt from a location outward of the first barrier to a location inward of the first barrier. The method also includes placing a second barrier within the cavity between the first barrier and the crucible. The second barrier defines a labyrinth of gaps for the melt to flow through. The method further includes placing feedstock material into the cavity and melting the feedstock material above the second barrier to form the melt. The melt moves through the gaps in the second barrier.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
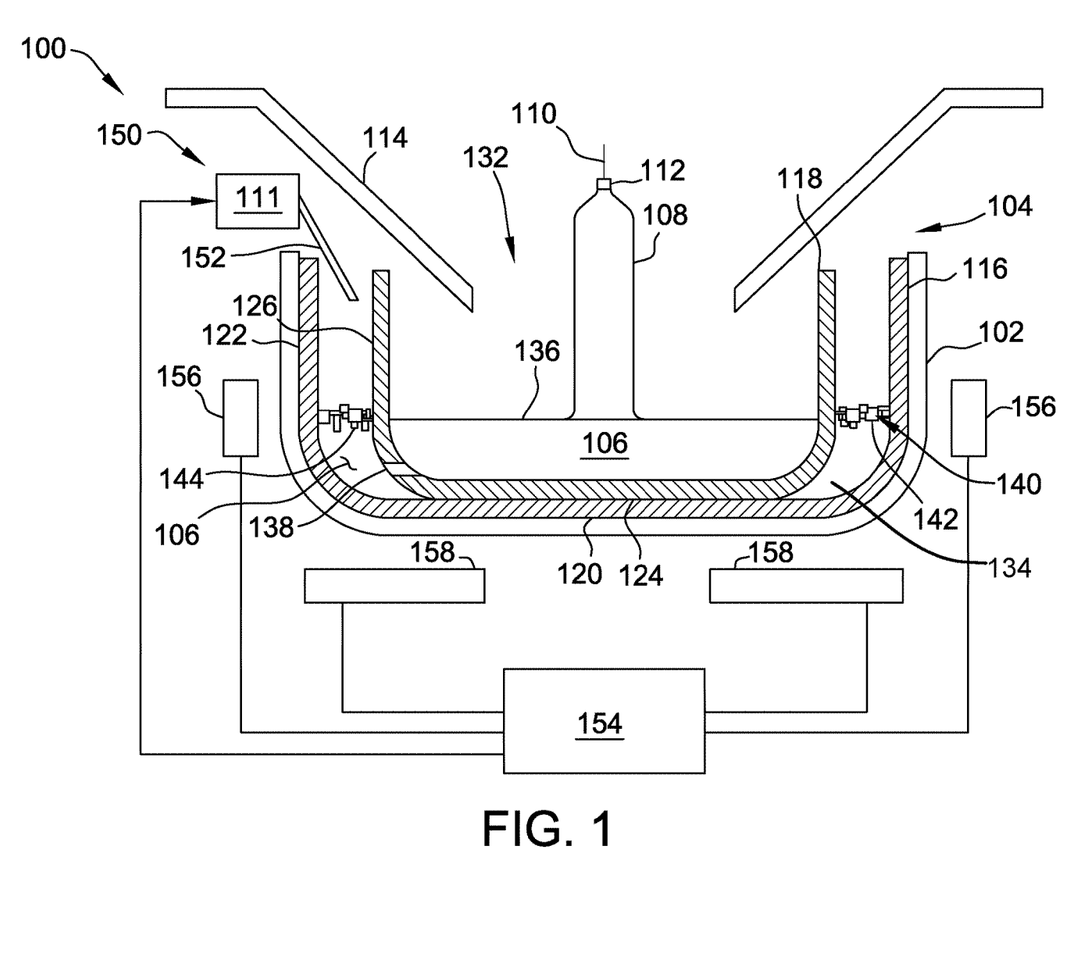
FIG. 1 is a schematic illustration of a crystal pulling system.

Referring to FIG. 1, a crystal pulling system is shown schematically and is indicated generally at 100. Crystal pulling system 100 may be used to produce an ingot by a Czochralski method.

The illustrated crystal pulling system 100 includes a susceptor 102 supporting a crucible assembly 104 that contains a melt 106 of semiconductor or solar grade material (e.g., silicon). Melt 106 may be formed by heating a solid feedstock material 111. During operation of system 100, a seed crystal 112 is lowered by a puller 110 into melt 106 and then slowly raised from melt 106. As seed crystal 112 is slowly raised from melt 106, silicon atoms from melt 106 align themselves with and attach to seed crystal 112 to form an ingot 108. The illustrated system 100 also includes a heat shield 114 to shield ingot 108 from radiant heat from melt 106 and allow ingot 108 to solidify.

Crucible assembly 104 includes a first crucible 116 and a second crucible 118. In other embodiments, system 100 may include one or more weirs in addition to or in place of any of first crucible 116 and second crucible 118. In suitable embodiments, crucible assembly 104 may be constructed of any suitable material that enables system 100 to function as described. For example, in some embodiments, crucible assembly 104 may be constructed of quartz.

First crucible 116 includes a first base 120 and a first sidewall 122. Second crucible 118 includes a second base 124 and a second sidewall 126. In the illustrated embodiment, first sidewall 122 extends around the circumference of first base 120 and second sidewall 126 extends around the circumference of second base 124. A cavity 132 is formed by the inner surface of first sidewall 122 and first base 120 of first crucible 116. In other embodiments, crucible assembly 104 may include any crucible that enables system 100 to operate as described.

In this embodiment, first crucible 116 and second crucible 118 are sized and shaped to allow placement of second crucible 118 within cavity 132 of first crucible 116. In some embodiments, first crucible 116 may have an external diameter of 40, 36, 32, 28, or 24-inches and second crucible 118 may have an external diameter of 36, 32, 28, 24, 22, or 20 inches. In other embodiments, each of first crucible 116 and second crucible 118 may have any suitable diameter that enables system 100 to operate as described. For example, in some embodiments, first crucible 116 may have an external diameter of 32-inches and second crucible 118 may have an external diameter of 22-inches.

First crucible 116 and second crucible 118 form an outer zone 134 and an inner zone 136. Outer zone 134 is formed in cavity 132 between the inner surface of first sidewall 122 and the outer surface of second sidewall 126. Inner zone 136 is formed within second crucible 118. The size of outer zone 134 and inner zone 136 is determined by the size of first crucible 116 and second crucible 118. For example, inner zone 136 has a diameter equal to the inner diameter of second crucible 118. In some embodiments, inner zone 136 has a diameter of approximately 19-inches. Moreover, in this embodiment, inner zone 136 is substantially free of barriers and obstructions. As a result, the growth area for ingot 108 may be increased and the distance from the growth area to any barriers, such as the inner surface of sidewall 126, may be increased in comparison to some known systems. Moreover, inner zone 136 provides a larger free surface area for melt 106 and allows better oxygen release in comparison to systems with smaller growth zones.

Second crucible 118 forms a first barrier that limits melt 106 flowing from outer zone 134 into inner zone 136. A crucible passageway 138 extends through sidewall 126 of second crucible 118 for melt 106 to move from outer zone 134 into inner zone 136. Crucible passageway 138 may be positioned along second base 124 to increase the distance that melt 106 travels to move into inner zone 136. While one passageway 138 is shown in FIG. 1, in suitable embodiments, second crucible 118 may include any suitable number of passageways 138.

In the illustrated embodiment, a barrier 140 is located in outer zone 134 between the inner surface of first sidewall 122 and the outer surface of second sidewall 126. Barrier 140 limits movement of melt 106 and solid feedstock material 111 through outer zone 134 towards inner zone 136. Accordingly, barrier 140 forms a second barrier that limits melt 106 and solid feedstock material 111 flowing from outer zone 134 into inner zone 136. Barrier 140 includes members or bodies 142 and gaps 144 defined between members 142. In operation, melt 106 may flow through gaps 144. In this embodiment, members 142 are randomly arranged within outer zone 134 and gaps 144 form a labyrinth or circuitous path for melt 106 to flow through. Accordingly, barrier 140 may constrain the movement of melt 106 and prevent the movement of solid feedstock material 111 through outer zone 134. In other embodiments, members 142 may be arranged in any manner that enables crystal pulling system 100 to operate as described.

In suitable embodiments, members 142 may be positioned anywhere in outer zone 134. In this embodiment, members 142 are positioned between inner surface of first sidewall 122 and the outer surface of second sidewall 126 adjacent the surface of melt 106. Also, in this embodiment, members 142 are not located within inner zone 136. Precise alignment and positioning of members 142 may not be required during assembly of system 100 because members 142 may be randomly arranged. In addition, the position of members 142 may shift during operation of system 100.

Figure 2:
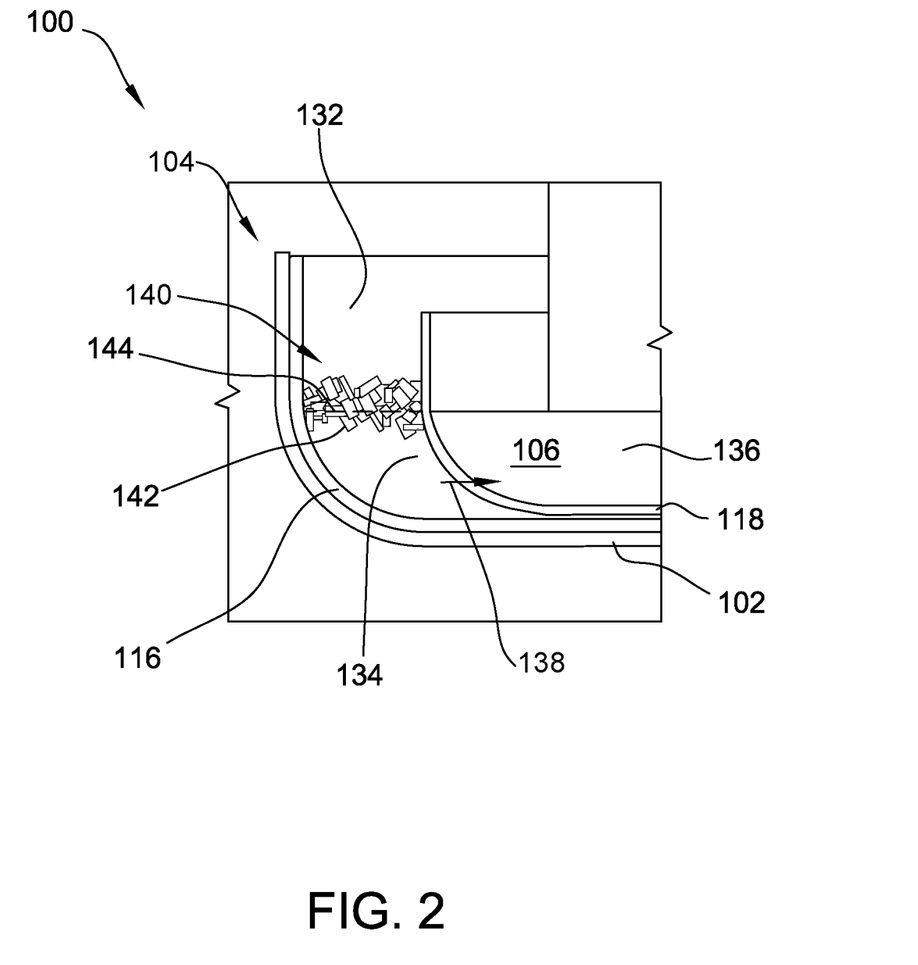
FIG. 2 is a schematic illustration of a portion of the crystal pulling system shown in FIG. 1.

In suitable embodiments, members 142 may be buoyant and float close to the surface of melt 106. Moreover, as shown in FIG. 2, members 142 may be stacked such that barrier 140 extends above and/or below the surface of melt 106. In suitable embodiments, members 142 may extend up to and beyond a melt line of a solid feedstock material 111. In other embodiments, members 142 may occupy any portion of system 100 that enables system 100 to operate as described. For example, in some embodiments, members 142 may fill outer zone 134.

In this embodiment, members 142 are free to move. In other words, members 142 are not connected to each other or to crucible assembly 104. As a result, the cost of assembling system 100 may be reduced. Moreover, the reliability of system 100 is increased because bonds that may fail during operation of system 100 are omitted. In other embodiments, at least some members 142 may be connected to first crucible 116, second crucible 118, and/or other members 142.

Barrier 140 may include any member 142 that enables barrier 140 to function as described. Members 142 form a network to prevent solid feedstock material 111 and crucible particles that fall from first crucible 116 and second crucible 118 into melt 106 to move toward inner zone 136. As shown in FIG. 2, barrier 140 includes members 142 made of quartz. As a result, members 142 may prevent contamination of melt 106. In addition, in some embodiments, members 142 are a uniform shape and size to provide precise control of characteristics of barrier 140 such as dissolution rate and network integrity. In other embodiments, at least some members 142 may be different shapes and sizes. For example, in suitable embodiments, members 142 may be irregular and uniquely shaped. In other embodiments, members 142 may be cuboid, conical, cylindrical, spherical, prismatic, pyramidal, and any other suitable shape.

Members 142 may be placed in system 100 at any suitable time. For example, members 142 may be placed in system 100 prior to solid feedstock material 111 being melted. In other embodiments, members 142 may be added after solid feedstock material 111 is melted.

During operation of system 100, members 142 of barrier 140 may be consumed by melt 106 and it may be necessary to replenish members 142 of barrier 140. Accordingly, members 142 may be added continuously or intermittently during operation of system 100. In suitable embodiments, members 142 may be added to barrier 140 at a rate approximately equal to the rate of consumption of members 142. In some embodiments, system 100 may include automated means, such as a feeder system, to add members 142. In other embodiments, members 142 may be added manually to system 100. In some embodiments, barrier 140 may include members 142 that do not need to be replenished. In further embodiments, barrier 140 may include extra members 142 to account for any consumption during operation of system 100.

With further reference to FIG. 1, crystal pulling system 100 includes heat shield 114 extending adjacent crucible assembly 104. Heat shield 114 covers a portion of inner zone 136 and all of outer zone 134 to prevent line-of-sight polysilicon projectiles from reaching the inner melt surface during the addition of solid feedstock material 111. In other embodiments, crystal pulling system 100 may include any suitable heat shield 114 that enables crystal pulling system 100 to operate as described.

Solid feedstock material 111 may be placed or supplied into outer zone 134 from a feeder 150 through a feed tube 152. Feed tube 152 is disposed adjacent first crucible 116 for supplying feedstock material 111 to first crucible 116 at a location that is outward of second crucible 118. Feedstock material 111 may have a much lower temperature than the surrounding melt 106. Accordingly, feedstock material 111 may absorb heat from melt 106 as the temperature of solid feedstock material 111 increases and solid feedstock material 111 liquefies in outer zone 134 to form an outer melt portion. As solid feedstock material 111 (sometimes referred to as "cold feedstock") absorbs energy from melt 106, the temperature of the surrounding melt 106 falls proportionately to the energy absorbed. In some embodiments, melt 106 may move through barrier 140 as solid feedstock material 111 melts. As a result, barrier 140 enables solid feedstock material 111 to melt completely within the outer zone, more particularly within the outer zone above barrier 140, and increases the uniformity of melt 106 within the inner zone.

As solid feedstock material 111 is added to melt 106, the surface of melt 106 may be disturbed. Barrier 140 and second sidewall 126 prevent inward propagation of the disturbances of melt 106. In particular, barrier 140 may contact solid feedstock material 111 as solid feedstock material 111 is delivered into the outer zone. As a result, barrier 140 may limit the surface disturbances, such as splashes, from solid feedstock material 111 being added to melt 106. Moreover, barrier 140 slows the movement of solid feedstock material 111 to facilitate solid feedstock material 111 melting completely within the outer zone.

Heat is provided to crucible assembly 104 by heaters 156 and 158 arranged at suitable positions about crucible assembly 104. Heat from heaters 156 and 158 initially melts solid feedstock material 111 and then maintains melt 106 in a liquefied state. Heater 156 is generally cylindrical in shape and provides heat to the sides of the crucible assembly 104. Heater 158 provides heat to the bottom of crucible assembly 104. In some embodiments, heater 158 may be generally annular in shape. In other embodiments, system 100 may include any heaters that enable system 100 to operate as described.

In suitable embodiments, heaters 156 and 158 may be resistive heaters coupled to controller 154, which controllably applies electric current to the heaters to alter their temperature. The amount of current supplied to each of heaters 156 and 158 by controller 154 may be separately and independently chosen to optimize the thermal characteristics of melt 106.

As discussed above, seed crystal 112 is attached to a portion of puller 110 located over melt 106. Puller 110 provides movement of seed crystal 112 in a direction perpendicular to the surface of melt 106 and allows seed crystal 112 to be lowered down toward or into melt 106, and raised up or out of melt 106. To produce a high quality ingot 108, the area adjacent to seed crystal 112/ingot 108 must be maintained at a substantially constant temperature and surface disruptions of melt 106 and solid feedstock 111 must be minimized.

In this embodiment, barrier 140 and second crucible 118 limit the surface disturbances, temperature fluctuations, and number of solid particles in the area immediately adjacent to seed crystal 112/ingot 108 by limiting the movement of melt 106 from outer zone 134 into the growth area. The growth area is inward of the second crucible 118 and adjacent to the seed crystal 112/ingot 108.

As shown in FIG. 2, barrier 140 and passageway 138 provide a tortuous path for melt 106 to move from outer zone 134 into inner zone 136. In particular, melt 106 moves through gaps 144 in barrier 140 as melt 106 moves through outer zone 134. Moreover, melt 106 must move through passageway 138 in second crucible 118 to move into inner zone 136. As a result, barrier 140 and second crucible 118 limit movement of melt 106 in outer zone 134 towards inner zone 136. In addition, any movement of melt 106 from outer zone 134 into inner zone 136 is spaced from the top of melt 106, where ingot 108 is being pulled, because passageway 138 is located along the bottom of crucible assembly 104. Thus, the position of passageway 138 further limits surface disruptions, temperature fluctuations, and passage of solid particles to the growth area of melt 106.

The controlled movement of melt 106 through outer zone 134 and between outer zone 134 and inner zone 136 allows feedstock material 111 in outer zone 134 to heat to a temperature that is approximately equivalent to the temperature of the growth area as feedstock material 111 passes through outer zone 134. Accordingly, solid particles are melted in outer zone 134 above barrier 140 and do not enter the growth area. Moreover, system 100 may have a larger growth area and produce larger single crystal ingots because the movement of melt 106 is controlled in outer zone 134 and inner zone 136 is free of any barriers.

Figure 3:
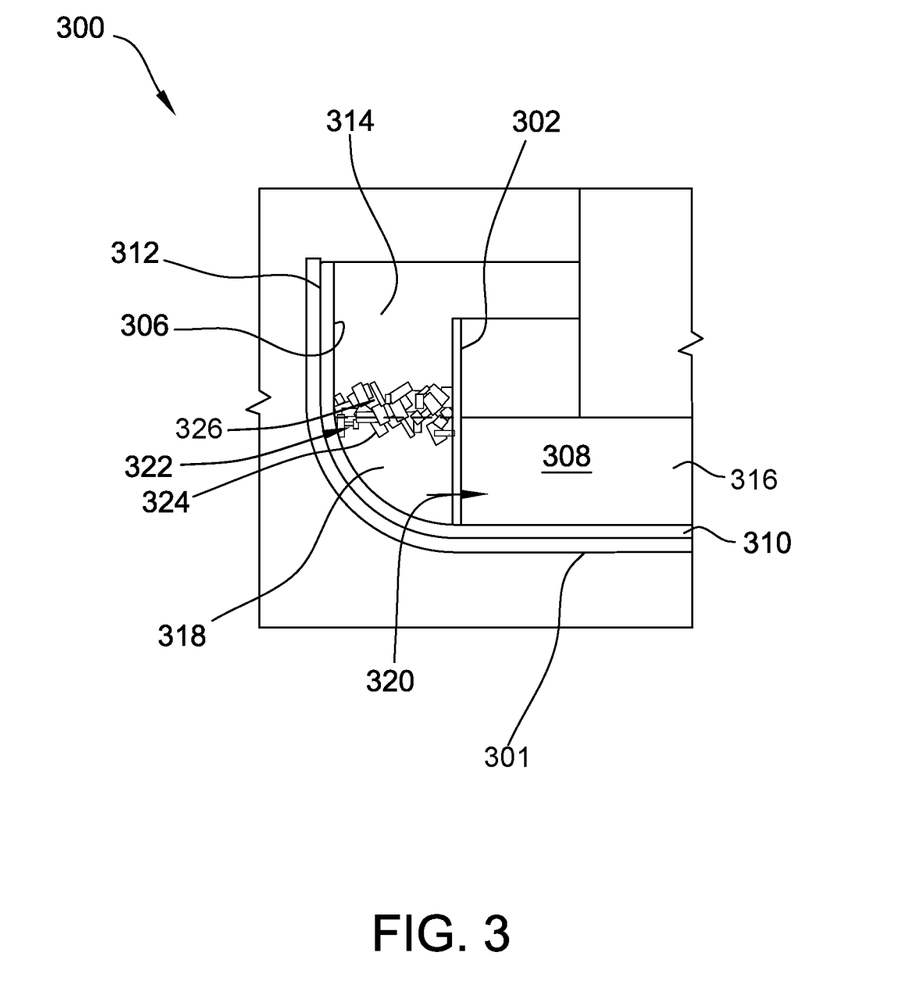
FIG. 3 is a schematic illustration of a portion of a crystal pulling system including a weir.

FIG. 3 is a schematic illustration of a portion of a crystal pulling system 300 including a weir 302. Crystal pulling system 300 includes a crucible 306 for containing a melt 308 and a susceptor 301 supporting crucible 306. Crucible 306 includes a base 310 and a sidewall 312 defining a cavity 314. Weir 302 is located in cavity 314 of crucible 306 and circumscribes an inner zone 316. In addition, weir 302 and crucible 306 define an outer zone 318 therebetween.

In operation, crystal pulling system 300 forms an ingot from melt 308 by lowering and raising a seed crystal in a growth area of inner zone 316. A passageway 320 is defined through weir 302 for melt 308 to move from outer zone 318 into inner zone 316. Accordingly, weir 302 controls movement of melt 308 between outer zone 318 and inner zone 316.

System 300 further includes a barrier 322 positioned in outer zone 318 to limit movement of melt 308 through outer zone 318. In this embodiment, barrier 322 includes members 324 stacked between an inner surface of sidewall 312 and an outer surface of weir 302. Members 324 are loosely arranged in layers in outer zone 318. Moreover, members 324 may be buoyant such that members 324 float near a surface of melt 308. Barrier 322 further includes gaps 326 defined between members 324 for melt 308 to flow from outer zone 318 into inner zone 316. In other embodiments, system 300 may include any suitable barrier 322 positioned anywhere in outer zone 318 that enables system 300 to operate as described.

Figure 4:
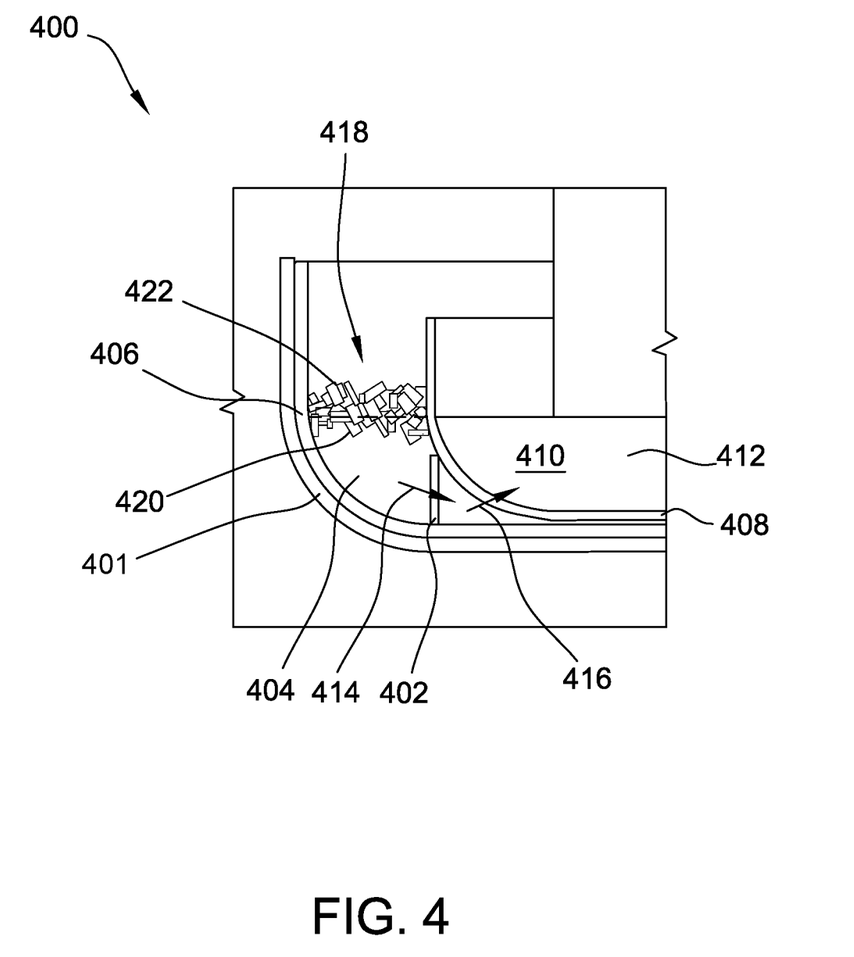
FIG. 4 is a schematic illustration of a portion of a crystal pulling system including a barrier ring.

FIG. 4 is a schematic illustration of a portion of a crystal pulling system 400 including a barrier ring 402. Crystal pulling system 400 also includes a susceptor 401, a first crucible 406, and a second crucible 408. Crystal pulling system 400 may be used to form an ingot from a melt 410 contained in first crucible 406 and second crucible 408. Second crucible 408 is positioned in a cavity of first crucible 406 such that first crucible 406 and second crucible 408 form an outer zone 404 therebetween. Barrier ring 402 extends through outer zone 404 about second crucible 408. In other embodiments, crystal pulling system 400 may include any barrier ring 402 that enables crystal pulling system 400 to operate as described. For example, in some embodiments, barrier ring 402 may extend about and be connected to a weir.

As melt 410 is heated, melt 410 moves from outer zone 404 towards an inner zone 412 where the ingot is formed. Barrier ring 402 extends adjacent a base of second crucible 408 to limit melt 410 moving from outer zone 404 into inner zone 412. Barrier ring 402 and second crucible 408 include respective passageways 414, 416 for melt 410 to flow through from outer zone 404 into inner zone 412. Suitably, passageway 414 in barrier ring 402 is offset from passageway 416 in first crucible 406 such that melt 410 flows through a circuitous path from outer zone 404 into inner zone 412. In this embodiment, passageways 414, 416 in barrier ring 402 and second crucible 408 are offset by approximately 180° to maximize the distance melt 410 travels. In other embodiments, barrier ring 402 and second crucible 408 may include any suitable passageway that enables system 400 to operate as described. For example, in some embodiments, passageways 414, 416 may be aligned. In further embodiments, passageways 414, 416 may have any offset in a range of 0° to 180°.

In this embodiment, system 400 includes a barrier 418 in outer zone 404 to limit melt 410 flowing through outer zone 404 towards inner zone 412. Barrier 418 includes members 420 arranged to form gaps 422. In the illustrated embodiment, members 420 are floating near the surface of melt 410. In other embodiments, barrier 418 may include any members 420 that enable barrier 418 to function as described. In some embodiments, barrier 418 may be omitted.

In suitable embodiments, barrier 418 and barrier ring 402 may be constructed from any material that enables system 400 to operate as described. In this embodiment, barrier ring 402 and barrier 418 are constructed from quartz.

Figure 5:
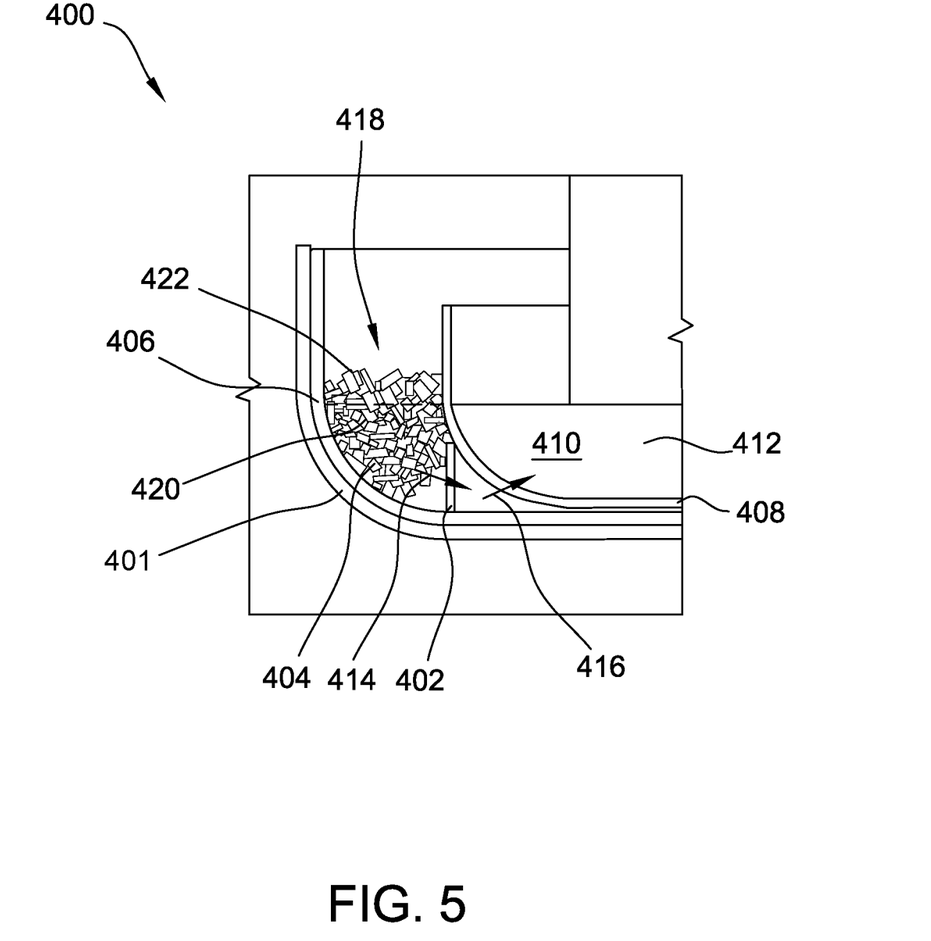
FIG. 5 is a schematic illustration of another configuration of the crystal pulling system shown in FIG. 4.

FIG. 5 illustrates a configuration of system 400 with barrier 418 extending to a melt line of melt 410. In particular, members 420 are stacked in layers and at least one layer extends to the melt line. As a result, solid feedstock material may contact barrier 418 prior to melting. After the solid feedstock material melts, at least a portion of melt 410 flows through barrier 418 and is slowed by barrier 418.

In suitable embodiments, barrier 418 may be positioned anywhere in system 400 that enables system 400 to operate as described. In this embodiment, barrier 418 and barrier ring 402 are positioned in outer zone 404 to control movement of melt 410. As a result, inner zone 412 may not be occupied by any barriers. Accordingly, the inner zone 412 includes increased free surface area to allow for more efficient reduction of oxygen content of melt 410 and a larger growth area.

Figure 6:
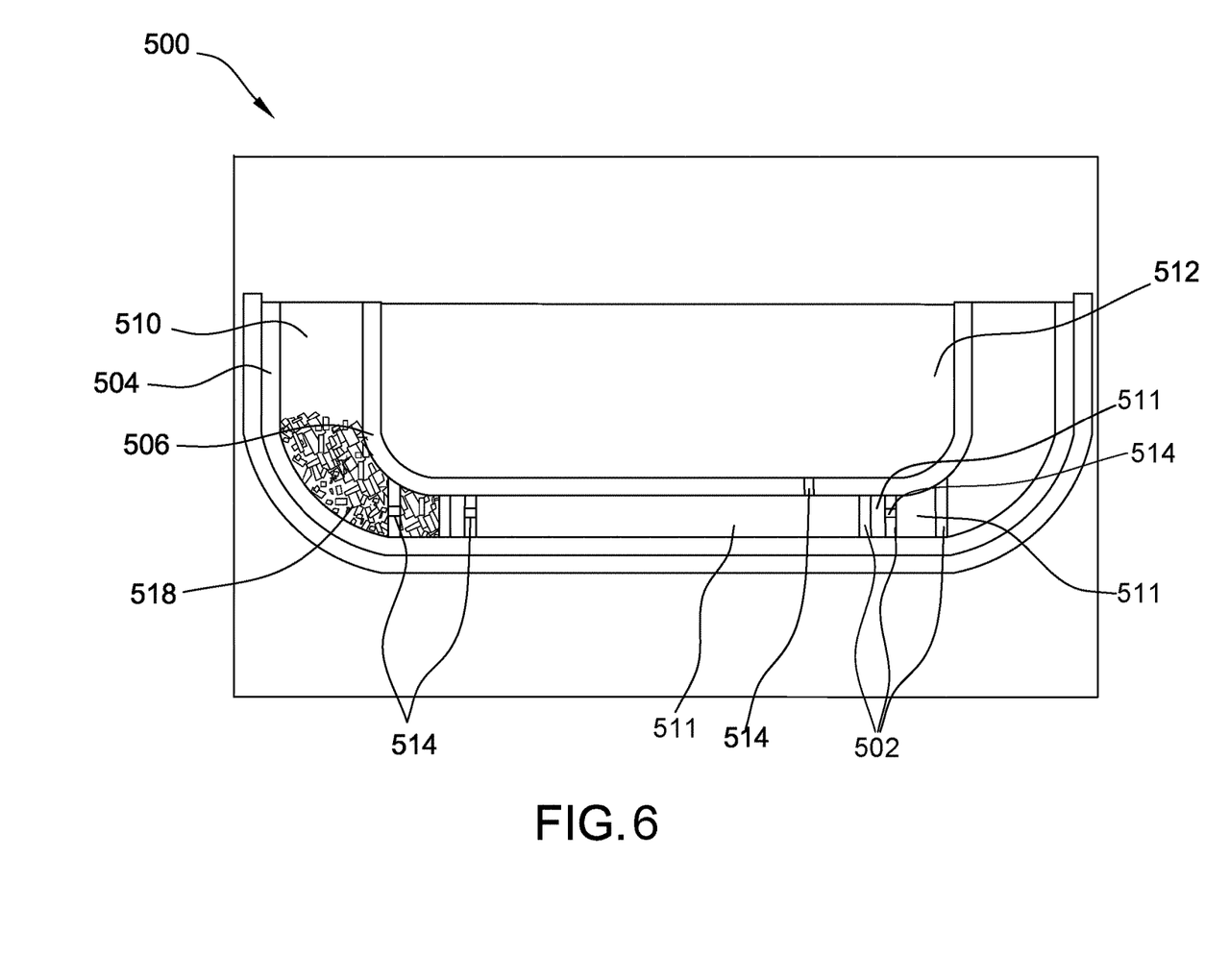
FIG. 6 is a schematic illustration of a crystal pulling system including barrier rings.

FIG. 6 is a schematic illustration of a crystal pulling system 500 including at least one barrier ring 502. Crystal pulling system 500 also includes a first crucible 504 and a second crucible 506. Crystal pulling system 500 may be used to form an ingot from a melt contained in first crucible 504 and second crucible 506. Second crucible 506 and barrier rings 502 are positioned in a cavity of first crucible 504 such that first crucible 504, second crucible 506, and an outer barrier ring 502 form an outer zone 510 therebetween. In addition, first crucible 504, second crucible 506, and barrier rings 502 form transition zones 511. In this embodiment, crystal pulling system 500 includes three barrier rings 502 forming three transition zones 511. Specifically, barrier rings 502 include an outer barrier ring 502, an intermediate barrier ring 502, and an inner barrier ring 502 forming an outer transition zone 511, an intermediate transition zone 511, and an inner transition zone 511. Barrier rings 502 are nested within each other in order of descending diameter. In other embodiments, crystal pulling system 500 may include any number of barrier rings 502 forming any transition zones 511 that enable crystal pulling system 500 to operate as described.

As the melt is heated, the melt moves from outer zone 510, through transition zones 511, and towards an inner zone 512 where the ingot is formed. Barrier rings 502 extend adjacent a base of second crucible 506 to inhibit the melt moving from outer zone 510 into inner zone 512. Barrier rings 502 and second crucible 506 include respective passageways 514 for the melt to flow from outer zone 510, through transition zones 511, and into inner zone 512. Suitably, passageways 514 in barrier rings 502 and second crucible 506 are offset such that the melt flows through a circuitous path from outer zone 510 into inner zone 512. In other embodiments, system 500 may include any suitable passageway that enables system 500 to operate as described.

In this embodiment, system 500 further includes members 518 disposed in outer zone 510 and transition zones 511. In this embodiment, members 518 are positioned adjacent and within outer barrier ring 502 and in outer transition zone 511. Accordingly, the amount of members 518 used in system 500 may be reduced because members 518 are positioned only in portions of the cavity adjacent passageways 514. In addition, the consumption of members 518 during operation of system 500 is reduced. In other embodiments, system 500 may include any members 518 that enable system 500 to operate as described.

In suitable embodiments, members 518 and barrier ring 502 may be constructed from any material that enables system 500 to operate as described. In this embodiment, barrier ring 502 and members 518 are constructed from quartz to reduce contamination of the melt.

Systems and methods in accordance with the examples described above achieve superior results compared to known systems and methods. The disclosed systems and methods reduce solid particles in a growth area of an ingot. In addition, oxygen content in the melt and in the crystal is reduced. Also, an example system provides a larger growth area for a single silicon crystal, while minimizing the cost of the system. As a result, the size of the single silicon crystal formed by the system may be increased in comparison to some known systems.

Also, the systems and methods described above include barriers that may reduce the cost to assemble and operate the systems. In addition, the systems may have better reliability and an increased service life because the barriers have a reduced risk of failure in comparison to some known systems.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the invention, it is intended that all matter contained in the above description and shown in the accompanying drawing[s] shall be interpreted as illustrative and not in a limiting sense.

What is claimed is:

1. A system for forming an ingot from a melt, the system comprising:
   a first crucible defining a cavity for receiving the melt;
   a second crucible in the cavity, the second crucible separating an outer zone from an inner zone, the second crucible including a sidewall and a passageway therethrough to allow the melt located within the outer zone to move into the inner zone, wherein the inner zone defines a growth area for the ingot, the sidewall extending above a surface of the melt to limit propagation of surface disturbance into the inner zone during an ingot forming process; and
   a barrier located within the outer zone to limit movement of the melt through the outer zone, the barrier including members that are arranged to define a labyrinth for melt flow, wherein the members contact each other to form a network that prevents movement of solid feedstock material and crucible particles toward the inner zone.

2. The system of claim 1, further comprising a feeder system to deliver solid feedstock material into the cavity, wherein the members extend substantially through the outer zone from the first crucible to the second crucible such that the melt moves through the barrier as the solid feedstock material melts.

3. The system of claim 2, wherein the members are buoyant such that the solid feedstock material contacts the barrier prior to melting.

4. The system of claim 1, wherein the members include quartz to prevent contamination of the melt.

5. The system of claim 4, wherein the first crucible and the second crucible include quartz.

6. The system of claim 1, further comprising a barrier ring extending through the outer zone about a base of the second crucible and below the surface of the melt during the ingot forming process, the barrier ring including a second passageway for the melt to flow through.

7. The system of claim 6, wherein the barrier ring includes quartz.

8. The system of claim 1, wherein the members have at least one of the following shapes: cuboid, conical, cylindrical, spherical, prismatic, and pyramidal.

9. The system of claim 1, wherein the members are irregular.

10. The system of claim 1, wherein the barrier extends to a melt line.

11. A system for forming an ingot from a melt, the system comprising:
    a crucible defining a cavity for receiving the melt;
    a weir connected to the crucible, the weir positioned in the cavity to limit movement of the melt from outward of the weir to inward of the weir, the crucible and the weir forming an outer zone and an inner zone, the weir including a sidewall and a passageway to allow the melt located within the outer zone to move into the inner zone, the sidewall extending above a surface of the melt to limit propagation of surface disturbance into the inner zone during an ingot forming process; and
    a barrier within the outer zone to limit movement of the melt through the outer zone, the barrier including members that are arranged to define gaps through the barrier, the gaps defining a labyrinth of gaps for melt flow through the barrier from the outer zone to the inner zone, wherein the members contact each other to form a network that prevents movement of solid feedstock material and crucible particles toward the inner zone.

12. The system of claim 11, wherein the members include quartz.

13. The system of claim 11, wherein the members are free to move within the outer zone.

14. The system of claim 11, wherein the barrier extends throughout the outer zone from a crucible sidewall to the weir.

15. The system of claim 11, wherein the members have at least one of the following shapes: cuboid, conical, cylindrical, spherical, prismatic, and pyramidal.

16. The system of claim 11, further comprising a barrier ring extending about a base of the weir, wherein the barrier ring includes quartz.

17. The system of claim 16, wherein the barrier ring is connected to the weir and the crucible.

18. A method for pulling a crystal ingot from a melt in a crystal pulling system, the system including a crucible defining a cavity, the method comprising:
    placing a first barrier within the cavity to limit movement of the melt from a location outward of the first barrier to a location inward of the first barrier, the first barrier including a sidewall extending above a surface of the melt to limit propagation of surface disturbance inward of the first barrier during an ingot forming process;
    placing a second barrier within the cavity between the first barrier and the crucible, the second barrier defining a labyrinth of gaps through the second barrier for the melt to flow through the second barrier and to a location inward of the first barrier;
    placing feedstock material into the cavity; and
    melting the feedstock material above the second barrier to form the melt, the melt moving through the gaps in the second barrier, the second barrier including members that contact each other to form a network that prevents movement of solid feedstock material and crucible particles toward an inner zone.

19. The method of claim 18, wherein placing the second barrier within the cavity between the first barrier and the crucible comprises placing members within the cavity, the members defining the labyrinth of gaps therebetween.

20. The method of claim 19, further comprising placing the members into the cavity while melting the feedstock material.

21. The method of claim 19, wherein placing the members within the cavity between the first barrier and the crucible comprises placing the members within the cavity throughout an outer zone defined between the first barrier and the crucible.

22. The method of claim 19, further comprising arranging the members such that the second barrier extends to a melt line of the melt.

* * * * *